(12) United States Patent
Ding et al.

(10) Patent No.: US 11,516,566 B2
(45) Date of Patent: Nov. 29, 2022

(54) SPEAKER BOX

(71) Applicant: AAC Technologies Pte. Ltd., Singapore (SG)

(72) Inventors: Jianhua Ding, Shenzhen (CN); Guoxiu Feng, Shenzhen (CN)

(73) Assignee: AAC Technologies Pte. Ltd., Singapore (SG)

( * ) Notice: Subject to any disclaimer, the term of this patent is extended or adjusted under 35 U.S.C. 154(b) by 131 days.

(21) Appl. No.: 16/994,705

(22) Filed: Aug. 17, 2020

(65) Prior Publication Data

US 2020/0413174 A1 Dec. 31, 2020

Related U.S. Application Data

(63) Continuation of application No. PCT/CN2019/093259, filed on Jun. 27, 2019.

(51) Int. Cl.
*H04R 1/02* (2006.01)
*H05K 1/11* (2006.01)
*H04R 3/00* (2006.01)
*H05K 1/18* (2006.01)

(52) U.S. Cl.
CPC .............. *H04R 1/025* (2013.01); *H04R 3/00* (2013.01); *H05K 1/118* (2013.01); *H05K 1/189* (2013.01); *H05K 2201/10083* (2013.01)

(58) Field of Classification Search
CPC ...... H04R 1/025; H04R 3/00; H04R 2499/11; H05K 1/118; H05K 1/189; H05K 2201/10083
See application file for complete search history.

(56) References Cited

U.S. PATENT DOCUMENTS

| | | | |
|---|---|---|---|
| 10,015,574 B1 * | 7/2018 | Luce | H04R 1/04 |
| 2017/0099548 A1 * | 4/2017 | Schoeffmann | H04R 1/288 |
| 2021/0120343 A1 * | 4/2021 | Zhang | H04R 9/06 |

* cited by examiner

*Primary Examiner* — Jason R Kurr
(74) *Attorney, Agent, or Firm* — W&G Law Group

(57) ABSTRACT

A speaker box includes a housing, a speaker unit and a flexible circuit board. The housing includes a base defining a through hole, and a cover. The flexible circuit board includes an end received in the housing and an opposite end exposed to outside of the housing. The flexible circuit board includes a first surface facing the cover and a second surface opposite to the cover. A first pad and a second pad are disposed at the second surface. The flexible circuit board includes a first mounting part, a second mounting part and a bending part. The first pad is arranged on the first mounting part and configured to be electrically coupled to the speaker unit. The second pad is arranged on the second mounting part and configured to be electrically coupled to external circuits. The second pad is exposed to outside of the housing via the through hole.

8 Claims, 6 Drawing Sheets

SPEAKER BOX

CROSS REFERENCE TO RELATED APPLICATIONS

This non-provisional patent application is a continuation application of International Application PCT/CN2019/093259, filed on Jun. 27, 2019, all contents of which are incorporated herein by reference.

FIELD OF THE INVENTION

The present disclosure relates to the field of electro-acoustic transducers, and in particular to a speaker box.

BACKGROUND

In recent years, with the remarkable development of science and technology, especially the development of mobile communication technology, more and more mobile electronic devices appear in people's daily life, such as smart phones, tablet computers, notebook computers and multifunction media players have already become indispensable personal belongings in people's life. With the popularity of these mobile electronic devices, the control of manufacturing costs is becoming more and more important for manufacturers. Thus, how to reduce manufacturing costs has become the focus of attention.

The speaker box as a voice play device has become a key component of the above mobile electronic equipment, which has a great impact on the manufacturing costs. A speaker box in the related art includes a housing, a speaker unit, and a flexible circuit board. The flexible circuit board includes two pads which are respectively located on opposite sides of the flexible circuit board.

However, an end of the flexible circuit board of the related art which is located inside of the housing needs to be bent 180 degrees during assembly, so that the pad on the end of the flexible circuit board is exposed to the outside of the housing for being electrically connected to the external circuit. Due to limitation of the structure of the housing, sometimes it is impossible to bend the flexible circuit board 180 degrees to cause one end of the flexible circuit board to reach the outside of the housing. Furthermore, bending 180-degree not only makes the manufacturing process complicated, but also weakens the overall strength of the flexible circuit board and increases the manufacturing cost.

Therefore, it is desired to provide an improved speaker box which can overcome at least one of the above problems.

SUMMARY

Accordingly, the present disclosure aims to solve the problem that a speaker box has high manufacturing cost due to the complicated manufacturing process and weak overall strength of a double-sided flexible circuit board applied in the speaker box. The present disclosure provides a speaker box which can overcome at least one of the above problems.

The present disclosure provides a speaker box which comprises a housing, a speaker unit accommodated in the housing and a flexible circuit board electrically coupled to the speaker unit. The housing comprising a base and a cover cooperatively forming an accommodation space. The base defines a through hole. The speaker unit is accommodated in the accommodation space of the housing. The flexible circuit board comprises an end received in the housing and an opposite end exposed to outside of the housing. The flexible circuit board comprises a first surface facing the cover and a second surface opposite to the first surface and the cover. A first pad and a second pad are disposed at the second surface. The flexible circuit board comprises a first mounting part, a second mounting part and a bending part connected between the first mounting part and the second mounting part. The first pad is arranged on the first mounting part and configured to be electrically coupled to the speaker unit, and the second pad is arranged on the second mounting part and configured to be electrically coupled to external circuits. The second pad is exposed to outside of the housing via the through hole.

In some embodiments, the first mounting part and the second mounting part are flat plate-shaped and the bending part is ladder-like shaped.

In some embodiments, the first mounting part is U-shaped and comprises a body and two legs extending from opposite ends of the body, the first pad being disposed at the legs.

In some embodiments, the bending part comprises a first bending section, a first connecting section, a second bending section, a second connecting section and a third bending section connected together sequentially, the first connecting section and the second connecting section extending horizontally, the first bending section being bent from the first mounting part in a direction away from the cover and connected with an end of the first connecting section, the second bending section being bent from the other end of the first connecting section in a direction toward the cover and connected with an end of the second connecting section, the third bending section being bent from the other end of the second connecting section in a direction toward the cover and connected with the second mounting part.

In some embodiments, the cover comprises a supporting portion conformed to the through hole, the supporting portion being received in the through hole, the second mounting part being mounted on the supporting portion with the second pad opposite to the supporting portion.

In some embodiments, the supporting portion is disposed at an inner surface of the cover.

In some embodiments, the supporting portion is made of plastic material.

In some embodiments, the through hole has a size conformed to that of the second pad.

In some embodiments, the flexible circuit board further comprises a plurality of spots configured to connect the flexible circuit board with the housing.

In some embodiments, the flexible circuit board has an integral structure.

Compared with the related art, the speaker box of the present disclosure has the following advantages:

Firstly, the same surface of the flexible circuit board is provided with the first pad configured to be electrically coupled to the speaker unit and the second pad configured to be electrically coupled to the external circuit. The bending part electrically connects the flexible circuit board, the external circuit and the speaker unit. The flexible circuit board which is a single-sided circuit board can meet the application requirement. Thus, the flexible circuit board is simple in manufacturing process, convenient for maintenance and easy to assembly, thereby improving the assembly efficiency and reducing the manufacturing cost.

Secondly, the base defines a through hole through which the second pad is exposed and a supporting portion is provided in the through hole. The supporting portion is capable of supporting the second mounting part and preventing the inner cavity of the speaker box from leaking air via the through hole.

Thirdly, the flexible circuit board further includes a plurality of spots configured to connect the flexible circuit board with the housing, making the structure of the flexible circuit board more stable.

Fourthly, the flexible circuit board is designed as an integral structure, so that the flexible circuit board has a high overall strength.

BRIEF DESCRIPTION OF THE DRAWINGS

In order to explain the technical solutions of the embodiments of the present disclosure more clearly, accompanying drawings used to describe the embodiments are briefly introduced below. It is evident that the drawings in the following description are only concerned with some embodiments of the present disclosure. For those skilled in the art, in a case where no inventive effort is made, other drawings may be obtained based on these drawings.

DESCRIPTION OF THE EMBODIMENTS

The technical solutions in embodiments of the present disclosure will be clearly and completely described with reference to the accompanying drawings of the present disclosure. It is evident that the elements described are only some rather than all embodiments of the present disclosure. Based on the embodiments of the present disclosure, all other embodiments obtained by those skilled in the art without making any inventive effort fall into the protection scope of the present disclosure.

Figure 1:
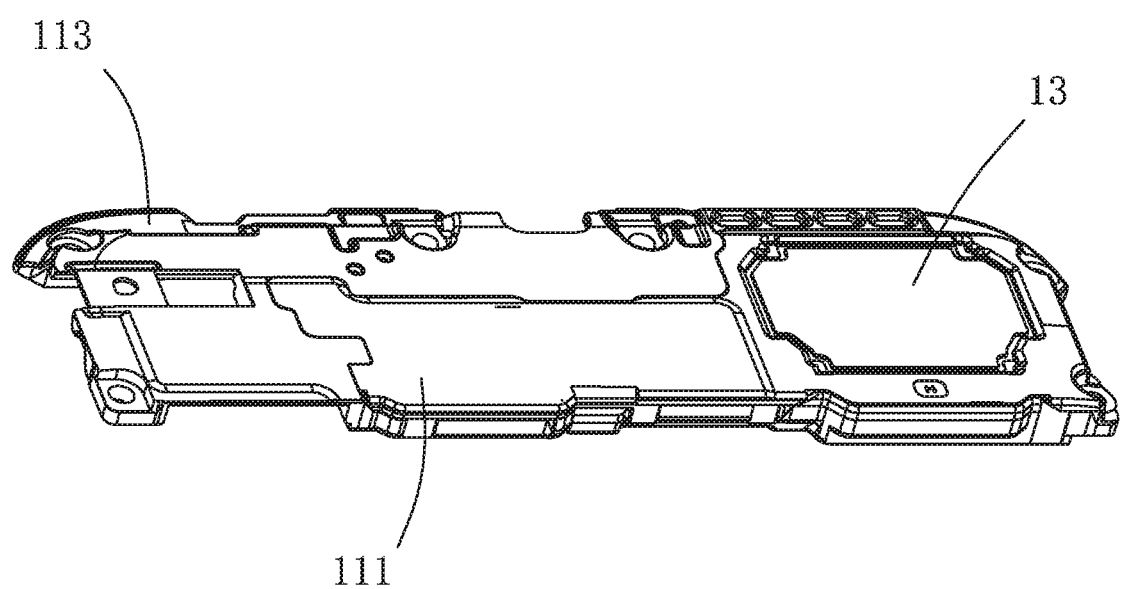
FIG. 1 is a perspective view of a speaker box in accordance with Embodiment I of the present disclosure.
Figure 2:
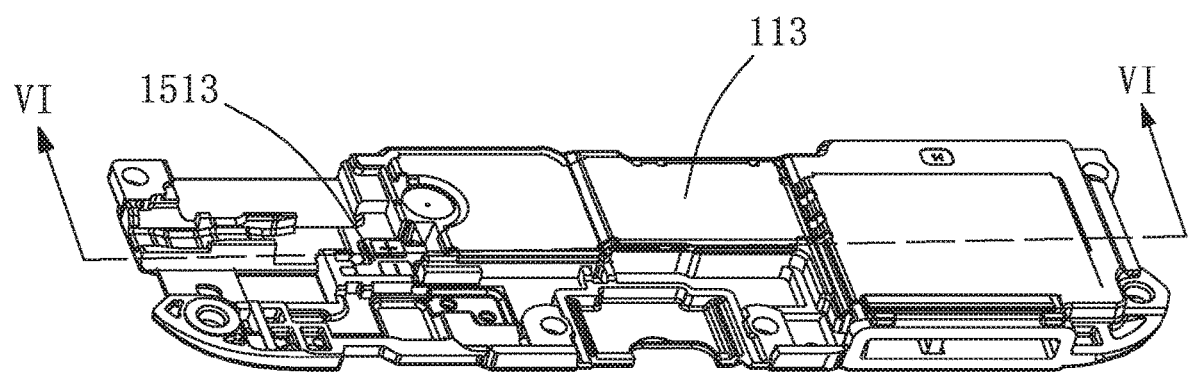
FIG. 2 illustrates the speaker box of FIG. 1, viewed from another aspect.
Figure 3:
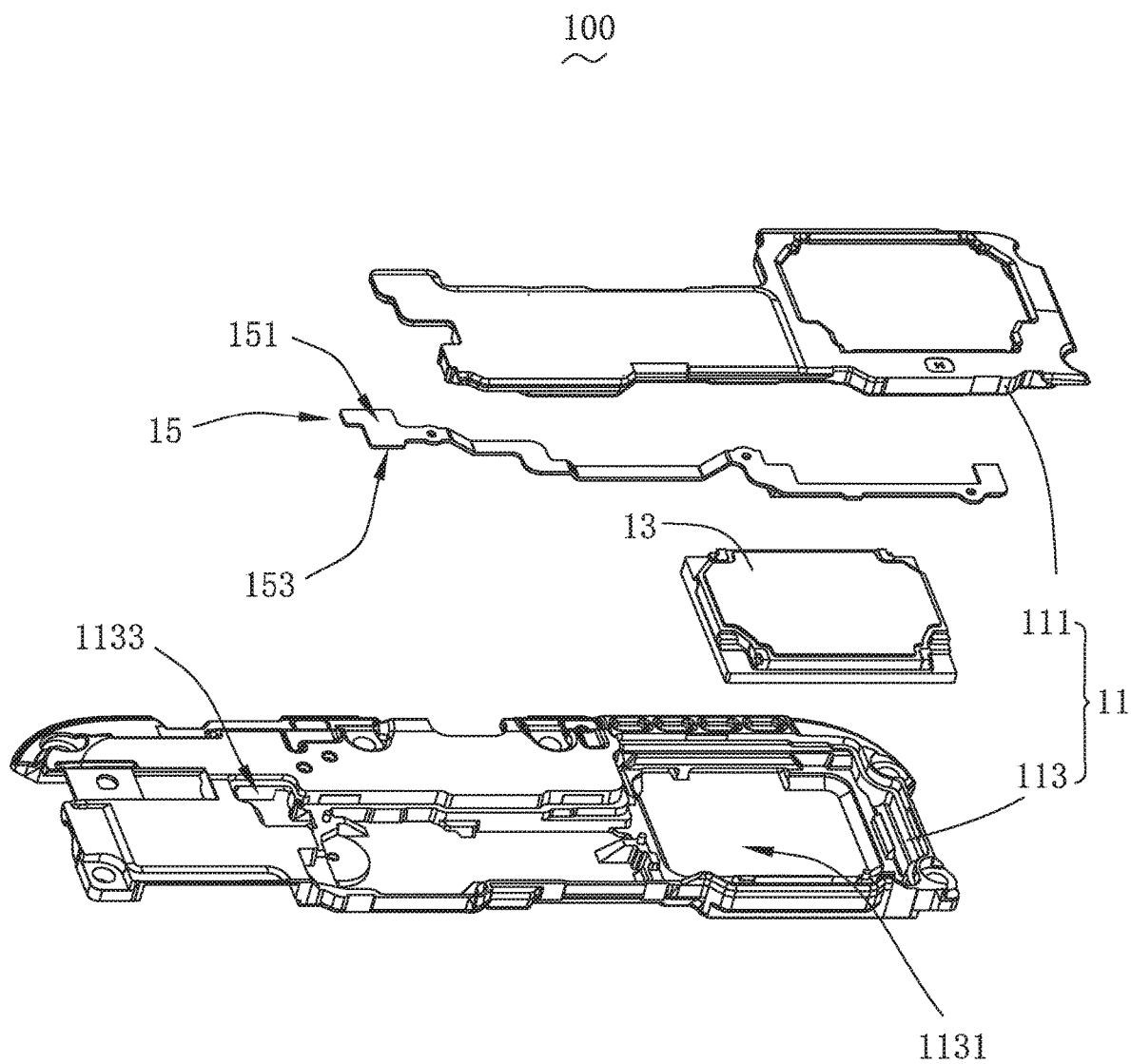
FIG. 3 is an exploded view of the speaker box of FIG. 1.

FIG. 1 is a perspective view of a speaker box in accordance with an exemplary embodiment of the present disclosure. FIG. 2 illustrates the speaker box of FIG. 1, viewed from another aspect. FIG. 3 is an exploded view of the speaker box of FIG. 1. Referring to FIG. 1 to FIG. 3, a speaker box 100 in accordance with an exemplary embodiment of the present disclosure comprises a housing 11, a speaker unit 13 accommodated in the housing 11, and a flexible circuit board 15 electrically coupled to the speaker unit 13. The housing 11 comprises a base 113 and a cover 111 which is assembled with the base 113. The base 113 defines an accommodation space 1131. The speaker unit 13 is accommodated in the accommodation space 1131 and covered by the cover 111. The flexible circuit board 15 comprises opposite two ends, one of which is received in the housing 11 and the other is exposed to outside the housing 11.

Figure 4:
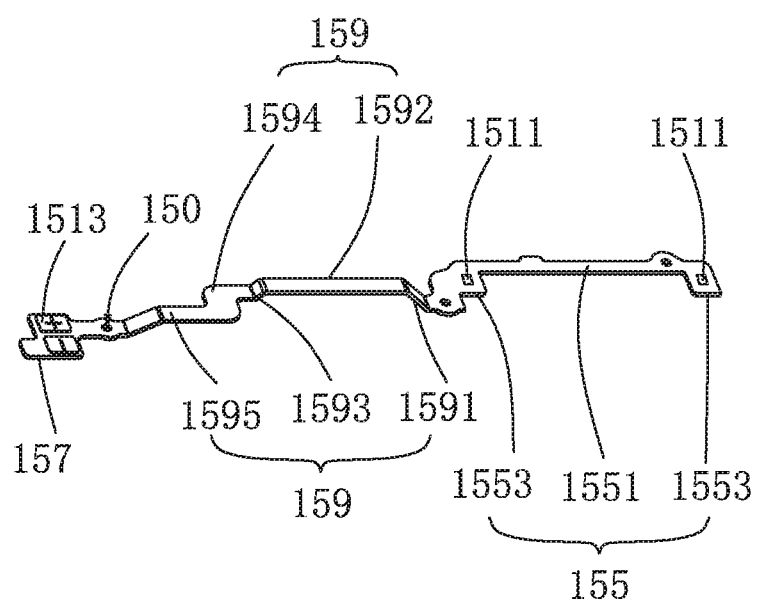
FIG. 4 is a perspective view of a circuit board of FIG. 3, viewed from another aspect.

Referring to FIG. 4, the flexible circuit board 15 comprises a first surface 151 facing the cover 111 and a second surface 153 opposite to the first surface 151. The second surface 153 is away from the cover 111. The second surface 153 of the flexible circuit board 15 comprises a first pad 1511 configured to be electrically coupled to the speaker unit 13, and a second pad 1513 configured to be electrically coupled to external circuits (not shown).

Referring to FIG. 4, the flexible circuit board 15 has an integral structure and comprises a first mounting part 155, a second mounting part 157 and a bending part 159 connected between the first mounting part 155 and the second mounting part 157. The first pad 1511 is disposed at the second surface of the first mounting part 155 and configured to be electrically coupled to the speaker unit 13. The second pad 1513 is disposed at the second surface of the second mounting part 157 and configured to be electrically coupled to the external circuits. The first mounting part 155 and the second mounting part 157 both are flat plate-shaped and extend horizontally. In this embodiment, the first mounting part 155 and the second mounting part 157 extending horizontally are perpendicular to the central axis of the speaker unit 13. The bending part 159 has a ladder-like shape. The bending part 159 comprises a plurality of bents so that the first pad 1511 and the second pad 1513 located at the same surface of the flexible circuit board 15 have the same orientation after the being part 159 being bent many times. The base 113 defines a through hole 1133. The second pad 1513 configured to be electrically coupled to the external circuits is exposed to outside of the base 113 via the through hole 1133.

In some embodiments, the first mounting part 155 is U-shaped and comprises a body 1551 and two legs 1553 extending from opposite ends of the body 1551. The first pads 1511 are disposed on the legs 1553.

The bending part 159 comprises a plurality of sections the length and direction of which depend on the space formed between the base 113 and the cover 111. In this embodiment, the bending part 159 comprises a first bending section 1591, a first connecting section 1592, a second bending section 1593, a second connecting section 1594 and a third bending section 1595 connected together sequentially. The first connecting section 1592 and the second connecting section 1594 extend horizontally. The first bending section 1591 is bent from the first mounting part 155 in a direction away from the cover 111 and connected with one end of the first connecting section 1592. The second bending section 1593 is bent from the other end of the first connecting section 1592 in a direction toward the cover 111 and connected with one end of the second connecting section 1594. The third bending section 1595 is bent from the other end of the second connecting section 1594 in a direction toward the cover 111 and connected with the second mounting part 157.

The flexible circuit board 15 further comprises a plurality of spots 150 configured to connect the flexible circuit board 15 with the housing 11.

Figure 5:
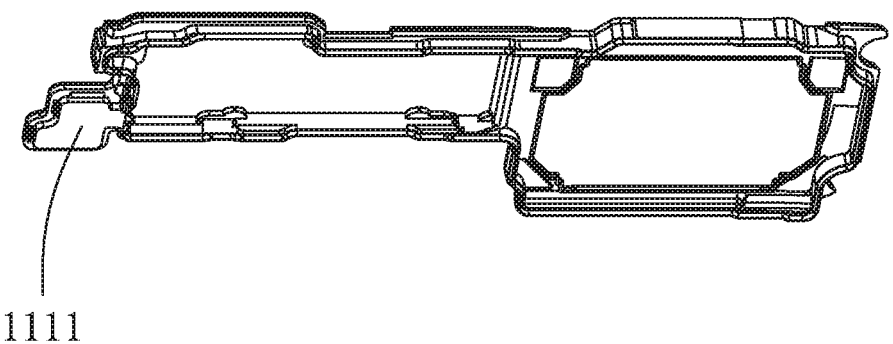
FIG. 5 is a perspective view of a cover of FIG. 3, viewed from another aspect.
Figure 6:
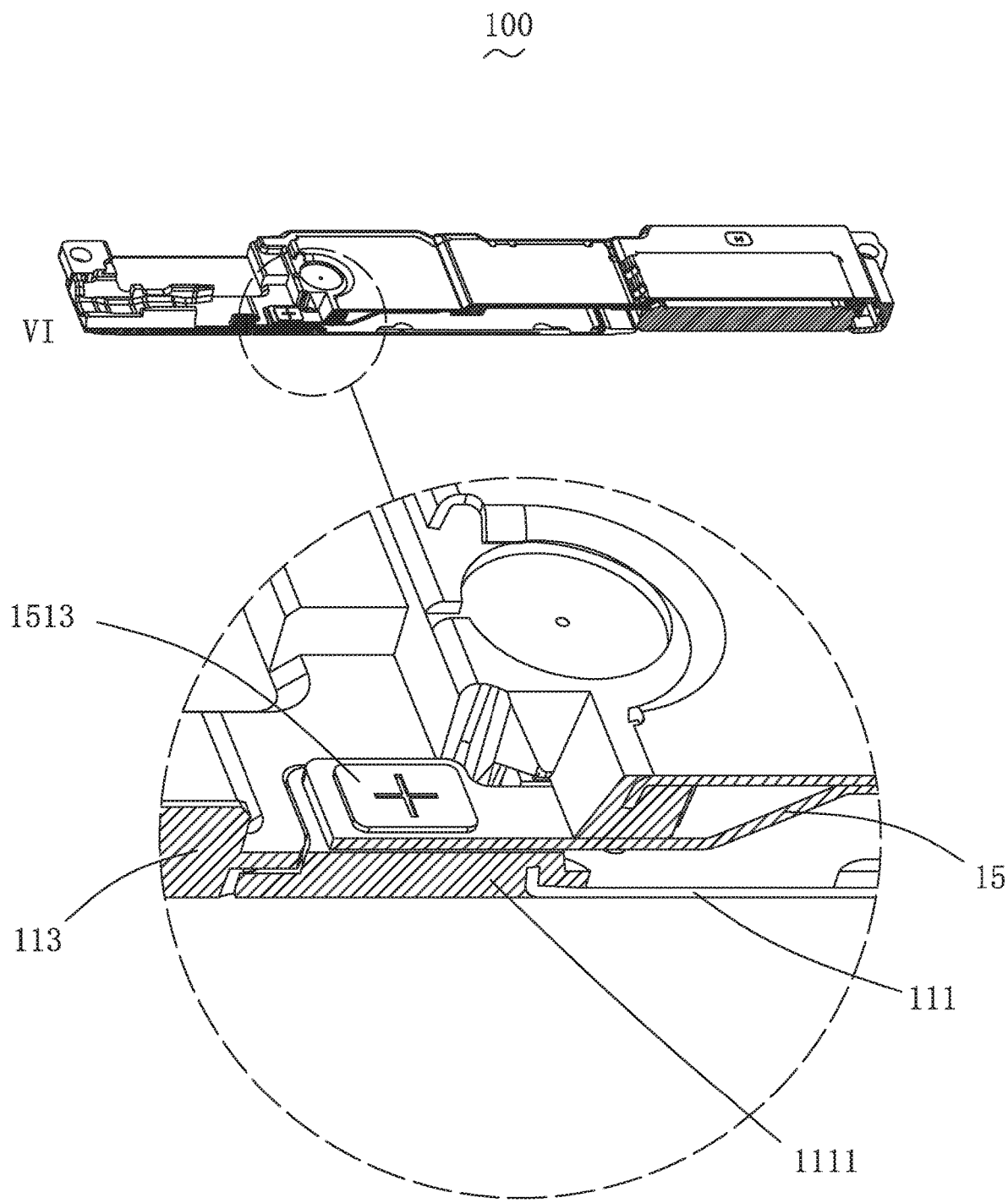
FIG. 6 is a cross sectional view of the speaker box taken along line VI-VI of FIG. 2.

FIG. 5 is a perspective view of a cover of FIG. 3, viewed from another aspect. FIG. 6 is a cross sectional view of the speaker box taken along line VI-VI of FIG. 2. Referring to FIGS. 5-6, the cover 111 comprises a supporting portion 1111 conformed to the through hole 1133 of the base 113. The supporting portion 1111 is received in the through hole 1133. The second mounting part 157 of the flexible circuit board 15 is supported on the supporting portion 1111 with the second pad 1513 being opposite from the supporting portion 1111, whereby the second pad 1513 being exposed to outside of the housing 11 for connecting with the external circuit. Except for supporting the second mounting part 157, the supporting portion 1111 is further capable of preventing the inner cavity of the speaker box from air leaking via the through hole 1133. Preferably, the size of the through hole 1133 conforms to that of the second pad 1513.

The supporting portion 1111 is disposed at the inner surface of the cover 111. The supporting portion 111 is made of plastic material which facilitates to attach the flexible circuit board 15 to the supporting portion 1111. Understandably, the supporting portion 1111 may integrally extend from the inner surface of the cover 111. That is, the cover 111 and the supporting portion 1111 are integrally formed from the same material.

Compared with the related art, the speaker box of the present disclosure has the following advantages:

Firstly, the same surface of the flexible circuit board is provided with the first pad configured to be electrically coupled to the speaker unit and the second pad configured to be electrically coupled to the external circuit. The bending part electrically connects the flexible circuit board, the external circuit and the speaker unit. The flexible circuit board which is a single-sided circuit board can meet the application requirement. Thus, the flexible circuit board is simple in manufacturing process, convenient for maintenance and easy to assembly, thereby improving the assembly efficiency and reducing the manufacturing cost.

Secondly, the base defines a through hole through which the second pad is exposed and a supporting portion is provided in the through hole. The supporting portion is capable of supporting the second mounting part and preventing the inner cavity of the speaker box from leaking air via the through hole.

Thirdly, the flexible circuit board further includes a plurality of spots configured to connect the flexible circuit board with the housing, making the structure of the flexible circuit board more stable.

Fourthly, the flexible circuit board is designed as an integral structure, so that the flexible circuit board has a high overall strength.

The above shows and describes the embodiments of the present disclosure. It is understandable that the embodiments above are only exemplary, and should not be interpreted as limiting the present disclosure, and those skilled in the art can make changes, modifications, replacements and deformations to the embodiments above within the scope of the present disclosure.

What is claimed is:

1. A speaker box comprising:
    a housing, the housing comprising a base and a cover cooperatively forming an accommodation space, the base defining a through hole;
    a speaker unit accommodated in the accommodation space of the housing; and
    a flexible circuit board electrically coupled to the speaker unit, the flexible circuit board comprising an end received in the housing and an opposite end exposed to outside of the housing;
    wherein the flexible circuit board comprises a first surface facing the cover and a second surface opposite to the first surface and the cover, a first pad and a second pad being disposed at the second surface;
    the flexible circuit board comprises a first mounting part, a second mounting part and a bending part connected between the first mounting part and the second mounting part;
    the first pad is arranged on the first mounting part and configured to be electrically coupled to the speaker unit; and
    the second pad is arranged on the second mounting part and configured to be electrically coupled to external circuits, the second pad being exposed to outside of the housing via the through hole;
    the first mounting part and the second mounting part are flat plate-shaped and the bending part is ladder-like shaped, the bending part comprises a first bending section, a first connecting section, a second bending section, a second connecting section and a third bending section connected together sequentially, the first connecting section and the second connecting section extending horizontally, the first bending section being bent from the first mounting part in a direction away from the cover and connected with an end of the first connecting section, the second bending section being bent from the other end of the first connecting section in a direction toward the cover and connected with an end of the second connecting section, the third bending section being bent from the other end of the second connecting section in a direction toward the cover and connected with the second mounting part.

2. The speaker box of claim 1, wherein the first mounting part is U-shaped and comprises a body and two legs extending from opposite ends of the body, the first pad being disposed at the legs.

3. The speaker box of claim 1, wherein the cover comprises a supporting portion conformed to the through hole, the supporting portion being received in the through hole, the second mounting part being mounted on the supporting portion with the second pad opposite to the supporting portion.

4. The speaker box of claim 3, wherein the supporting portion is disposed at an inner surface of the cover.

5. The speaker box of claim 3, wherein the supporting portion is made of plastic material.

6. The speaker box of claim 1, wherein the through hole has a size conformed to that of the second pad.

7. The speaker box of claim 1, wherein the flexible circuit board further comprises a plurality of spots configured to connect the flexible circuit board with the housing.

8. The speaker box of claim 1, wherein the flexible circuit board has an integral structure.

* * * * *